(12) United States Patent
Kreiser et al.

(10) Patent No.: US 6,953,338 B2
(45) Date of Patent: Oct. 11, 2005

(54) DEVICE FOR THERMAL TREATMENT OF SUBSTRATES

(75) Inventors: Uwe Kreiser, Ulm (DE); Karsten Weber, Leutenbach (DE); Wilfried Lerch, Dornstadt (DE); Michael Grandy, Senden (DE); Patrick Schmid, Dornstadt (DE); Jürgen Niess, Sontheim (DE); Olgun Altug, Ulm (DE)

(73) Assignee: Steag RTP Systems GmbH (DE)

( * ) Notice: Subject to any disclaimer, the term of this patent is extended or adjusted under 35 U.S.C. 154(b) by 0 days.

(21) Appl. No.: 10/182,594

(22) PCT Filed: Jan. 19, 2001

(86) PCT No.: PCT/EP01/00607

§ 371 (c)(1),
(2), (4) Date: Jul. 28, 2003

(87) PCT Pub. No.: WO01/56064

PCT Pub. Date: Aug. 2, 2001

(65) Prior Publication Data

US 2004/0029065 A1 Feb. 12, 2004

(30) Foreign Application Priority Data

Jan. 28, 2000 (DE) .......................................... 100 03 639

(51) Int. Cl.$^7$ ................................................. F27D 5/00
(52) U.S. Cl. .................................... 432/259; 211/41.18
(58) Field of Search .............................. 432/259, 258, 432/253; 211/41.18; 118/725

(56) References Cited

U.S. PATENT DOCUMENTS

| | | | | |
|---|---|---|---|---|
| 2,252,936 A | * | 8/1941 | Leydecker | 12/142 N |
| 3,020,617 A | * | 2/1962 | Dopera | 432/259 |
| 4,184,840 A | * | 1/1980 | Gamberg et al. | 432/253 |
| 5,201,653 A | * | 4/1993 | Hasegawa et al. | 432/170 |
| 5,431,700 A | | 7/1995 | Sloan | |
| 5,651,670 A | | 7/1997 | Okase et al. | |
| 5,817,156 A | | 10/1998 | Tateyama et al. | |
| 5,984,391 A | * | 11/1999 | Vanderpot et al. | 294/1.1 |
| 6,062,852 A | * | 5/2000 | Kawamoto et al. | 432/258 |
| 6,374,508 B1 | * | 4/2002 | Yudovsky et al. | 33/645 |
| 6,497,403 B2 | * | 12/2002 | Ries | 269/266 |
| 6,609,909 B2 | * | 8/2003 | Aoki et al. | 432/258 |

FOREIGN PATENT DOCUMENTS

| | | |
|---|---|---|
| EP | 1005063 | 5/2000 |
| JP | 021 39 935 | 5/1990 |
| JP | 111 450 25 | 5/1999 |

\* cited by examiner

*Primary Examiner*—Gregory Wilson
(74) *Attorney, Agent, or Firm*—Robert W. Becker & Associates; Robert W. Becker

(57) ABSTRACT

The aim of the invention is to reduce the formation of scratches in a device for the thermal treatment of substrates, in particular, semiconductor substrates, in a chamber in which the substrate is placed upon support elements. According to the invention, said aim is achieved by means of displaceable support elements.

23 Claims, 10 Drawing Sheets

Fig. 16
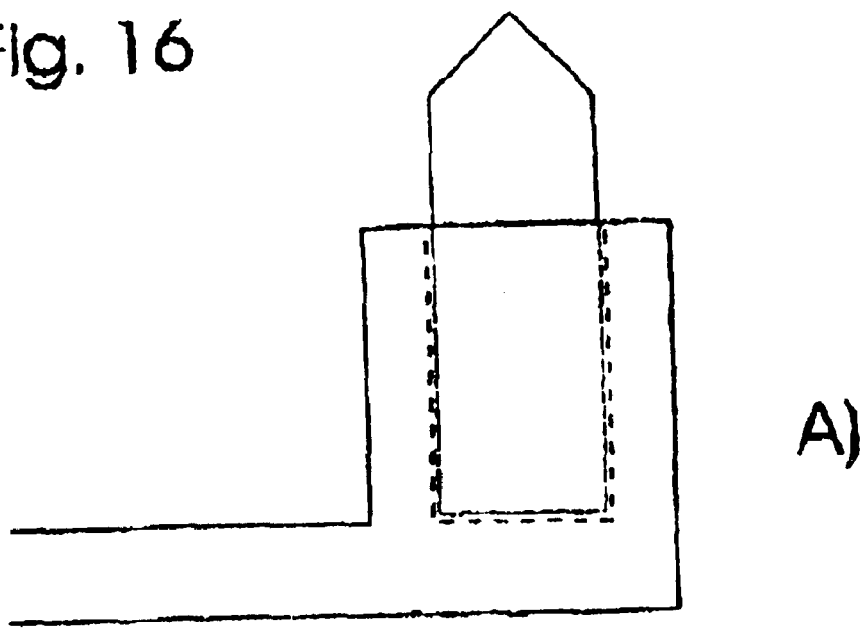
A)
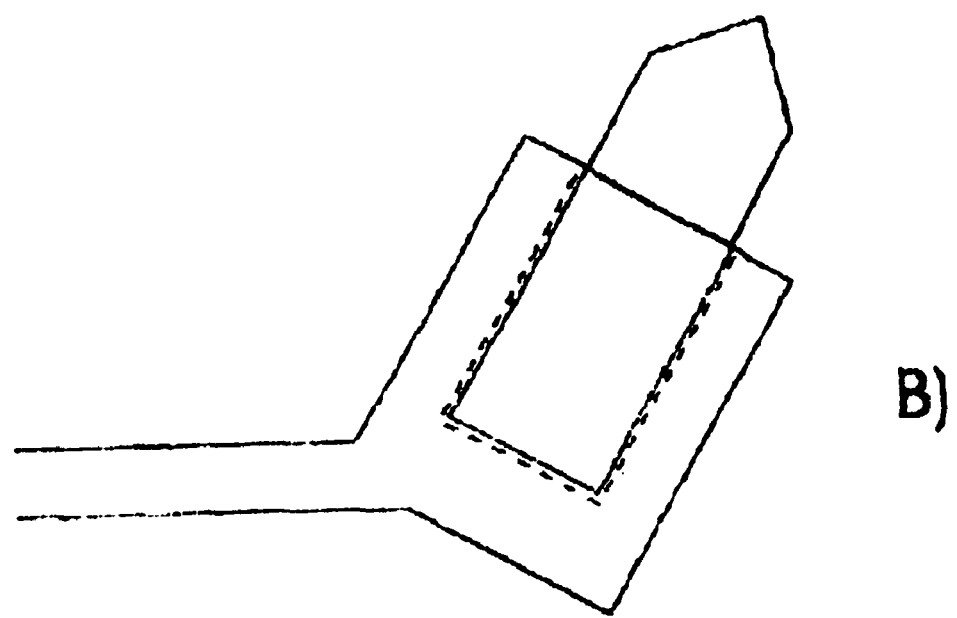
B)

DEVICE FOR THERMAL TREATMENT OF SUBSTRATES

BACKGROUND OF THE INVENTION

The present invention is related to an apparatus for the thermal treatment of substrates, especially semiconductor substrates, in a chamber in which the substrates are placed upon support elements.

An apparatus of this type for the treatment of substrates is known, for example, from DE-A-198 21 007 of the same applicant. With this apparatus, the support elements for carrying semiconductor wafers are rigidly connected to a rotary plate that is rotated for the homogenization of the thermal treatment of a semiconductor wafer.

An alternative carrier construction for the apparatus of the aforementioned type is illustrated, for example, in FIG. 1. Here a wafer 1 is placed upon conically shaped support studs 2 which are also called pins. The pins, along with their holding means 4, are rigidly secured to a carrier frame 3. The pins have conically shaped support tips in order to keep the contact surfaces between the support elements and the wafer small, and to thus minimize a transfer of heat from the wafer to the support element and to minimize a thereby resulting cooling off of the wafer in the region of the contact surface. Unfortunately, these support tips have the drawback that they break off easily and thereby result in undesired particles. Furthermore, the support tips leave behind mechanical impressions in the wafer that rests upon them, since at high temperatures the wafer material is relatively soft. Especially with wafers having relatively large diameters, such as, for example, 300 mm wafers, which have a weight of 130 g instead of 50 g for wafers having a 200 mm diameter, the pressure forces between support tips and wafer increase and thus the problem of mechanical impressions increases.

These mechanical impressions furthermore increase during the thermal treatment of the wafer due to the thermal expansion or distortion of the wafer and a thereby resulting relative movement between wafer and support pin. During the heating up of a wafer from room temperature to 1000° C., the thermally caused increase in diameter is, for example, in the region of 1 mm. Consequently, the tips of the support pins scrape over the surface of the wafer and at those locations leave behind long scratches, as illustrated by way of example in FIGS. 2a and 2b. FIGS. 2a and 2b show defect locations on the back side of a semiconductor wafer, which were produced by the known support pins during the thermal treatment of the wafer. The mechanical impressions and the scratch widths can be examined, for example, by cleavage. With this method, the wafer is broken up into predefined pieces, whereby a line of fracture or a fault line extends through a location that is to be examined. By means of an SIRD process (scanned infrared depolarization), one obtains an indication about the magnitude of the existing stresses at the contact locations. With this method, a double break produced by elastic deformation is measured that results with many transparent and isotropic materials due to deformation.

The mechanical impressions and scratches, as well as inhomogeneity of the wafer temperature during the thermal treatment, lead to dislocation errors, so-called slip lines, in the crystalline structure of the semiconductor wafer. Although these occur on the underside, i.e. the support side of the wafer, during the thermal treatment of the wafer they can, if the thermal stress is sufficiently great, propagate to the upper surface and damage or adversely affect the structures that are disposed on the upper surface. Such slip lines are visible, for example, from structural etching.

For a good thermal treatment of the semiconductor wafer, a homogeneous temperature distribution over the wafer is necessary. As already mentioned, due to the contact with the support pins, however, there results a localized cooling off of the wafer in the region of the contact, which leads to inhomogeneity of the temperature distribution upon the wafer. This problem was solved in the past in that the contact surface between support pin and wafer was kept small, which, however, worsened the aforementioned problem of scratching. In practice, the support pins were therefore positioned in an edge region of the wafer with a spacing of approximately 1 to 10 mm from the edge of the wafer. This was intended to ensure that the slip lines caused by the support forces did not damage the electronic components or structures disposed upon the surface of the wafer. However, this edge support results in the problem that during the thermal treatment the wafer sags, which again enhances the formation of dislocation errors or slip lines.

U.S. Pat. No. 5,817,156 furthermore discloses a substrate treatment apparatus that is provided with holding pins that are movable perpendicular to the plane of the substrate in order to position various regions at varying distances relative to a heating plate. However, with these holding pins the aforementioned problems of scratching occur that result from a relative movement between substrate and pin as a consequence of thermal expansion of the substrate.

Proceeding from the aforementioned state of the art, it is an object of the invention to provide an apparatus of the aforementioned type according to which the formation of scratches upon the surface of the wafer is reduced.

SUMMARY OF THE INVENTION

Pursuant to the invention, this object is realized in that the support elements are movable essentially parallel to the plane of the substrate. Due to the movable configuration of the support elements, they can follow a movement of the wafer during an expansion as a consequence of the thermal treatment. Thus, a scraping of the support elements upon the wafer surface is prevented. Instead of an elongated scratch, the support elements cause only a point-type impression. Furthermore, due to the movement that is directed essentially parallel to the substrate, the height or position of the substrates within the chamber is held essentially constant.

In this connection, the support elements are preferably movable radially relative to a central axis of the substrate in order to be able to follow the aforementioned expansion of the wafer, which is directed radially outwardly.

Pursuant to one embodiment of the invention, the support elements are suspended in a resilient manner in order to provide the necessary movability of the support elements. In this connection, the support elements are preferably respectively connected with a spring, especially a flat helical spring, via which not only a vertical but also a horizontal springiness can be achieved. The vertical springiness or resilience is expedient especially during the placement of the wafer in order to absorb forces that occur at this point in time.

Pursuant to a particularly preferred embodiment of the invention, the support elements are pivotable perpendicular to their longitudinal axis in order in a straightforward manner to provide the necessary movability of the support elements. In this connection, the pivot axis is preferably spaced from the longitudinal axis of the support element, so that in their position of rest the support elements are inclined in a predetermined position. The support elements are preferably inclined toward a central axis of the substrate, as a result of which they can follow an outwardly directed movement of the wafer over a greater distance.

Pursuant to another embodiment of the invention, pin-shaped support elements are mounted with great play in a sleeve-like receiving device. Due to the great play, the support elements are guaranteed the necessary freedom of movement in order to be able to follow the thermal expansion of the wafer. Pursuant to a very particular preferred embodiment of this receiving device, the sleeve is disposed so as to be tipped relative to the axis of the wafer so that the support pin is inclined relative to the center of the wafer.

Pursuant to a further embodiment of the invention, the support elements are preferably mounted on the free ends of movable carrier arms, whereby the movability of the support elements is provided via the carrier arms. In this connection, the carrier arms are preferably movable parallel to the plane of the substrate in order to follow the radial expansion of the wafer during the thermal treatment and to provide an essentially fixed height or position of the wafer within the chamber.

The support elements are preferably received in a guide in order to guide the movement in a prescribed direction. In this connection, the guide means is preferably a slot that preferably extends radially relative to a central axis of the substrate.

Pursuant to a further embodiment of the invention, the support elements are provided with a support flange upon which the support elements can, for example, glide in order to thus enable a movement of the support elements. In this connection, the support flange preferably has a curved support surface that provides a pivotable mounting of the support element. With a pivotable mounting of this type, there results the advantage that in contrast to a displaceable support flange, a lower friction occurs and thus a lower risk of damaging abrasion.

The support element is preferably light permeable and is embodied as an optical lens. In so doing, a shading effect is prevented with an apparatus with which the substrate is heated via a radiation field. Furthermore, due to the lens effect of the support flange, the radiation can be focused upon the contact location between support element and wafer, thereby compensating for the above described heat loss of the wafer at this location. This leads to a more homogeneous temperature distribution over the wafer.

Pursuant to one embodiment of the invention, a movable, especially tiltably mounted, holding element having at least three carrier arms and support elements secured thereon is provided. Due to the tiltable mounting of the hold element, small deviations in height of the support elements and/or of the wafer can be compensated. Furthermore, the support elements are preferably movably, epecially pivotably, mounted on the carrier arms in order to follow a movement of the substrate, especially a radially outwardly directed movement that is caused by the thermal treatment. Preferably, at least three of these holding elements are provided in order to provide a large number of support points and hence to reduce the pressure forces at the support points.

Pursuant to a further embodiment of the invention, the support elements are spheres or balls that are preferably respectively guided in a track or groove to enable the balls to roll on the track during a movement of the substrate and thus always contact only one point of the substrate surface.

In this connection, the track is preferably inclined relative to a central axis of the substrate so that after the substrate has been raised or removed, the balls always return to a predetermined position of rest.

To provide the movability of the support elements, pursuant to one embodiment of the invention, these support elements have a conically tapering base that is pivotably received in a receiving means.

To keep a transfer of heat from the wafer to the support elements low, the support elements are preferably provided with substrate support tips, as a result of which the contact surface between support element and substrate is reduced. In this connection, the substrate support tips are preferably formed by a cone that has a larger opening angle than does a subsequent second cone. As a consequence of this double cone, the support tips are less easily damaged, and in particular break off less easily. In this connection, the first cone preferably has an opening angle between 50° and 130° and especially preferably between 80° and 100°. The opening angle of the second cone is preferably between 5° and 45° especially between 5° and 25°.

Pursuant to one preferred embodiment of the invention, the support elements are disposed on a circle having a radius of ½ to ⅘ and preferably ⅔ of the substrate radius in order to avoid a sagging of the substrate toward the middle or toward the outside. In the upper region the sagging is the lowest, thereby reducing the formation of dislocation errors or slip lines.

To avoid a shading effect, and hence a non uniform thermal treatment, the support elements and/or their holding devices are comprised at least partially of a light-permeable material. In this connection, the surfaces of the support elements and/or their holding devices are at least partially polished, especially fire polished, in order to ensure a good passage of the thermal radiation.

Pursuant to one preferred embodiment, the support elements and/or their holding devices are produced from one or a combination of the following materials: quartz, magnesium oxide, zirconium oxide, silicon, silicon nitrite, silicon carbide, aluminum oxide, aluminum nitrite, boron nitrite, sapphire, SAPHAL or ceramic. The present invention is particularly suitable for rapid heating units with which a semiconductor wafer is heated via a radiation field.

BRIEF DESCRIPTION OF THE DRAWINGS

The invention will be explained in greater detail subsequently with the aid of preferred embodiments with reference to the figures. The figures show:

FIG. 16 alternative embodiments of a holding device for support pins.

DESCRIPTION OF PREFERRED EMBODIMENTS

The invention will be described in greater detail subsequently with the aid of FIGS. 4 to 16. The invention relates to an apparatus for the thermal treatment of substrates, especially semiconductor wafers, in a chamber in which the wafers are placed upon support elements. Such an apparatus is known, for example, from DE-A-198 21 007 of the same applicant, and to this extent is made the subject matter of the present invention in order to avoid repetition. The chamber in which the semiconductor wafer is placed upon the support elements is surrounded by a heating device that is comprised of lamps or banks of lamps that are disposed above and below the chamber. Pursuant to the present invention, the support elements are movably or displaceably mounted in order to follow a movement of the wafer, especially during an expansion or other distortion resulting from the thermal treatment.

Figure 1:
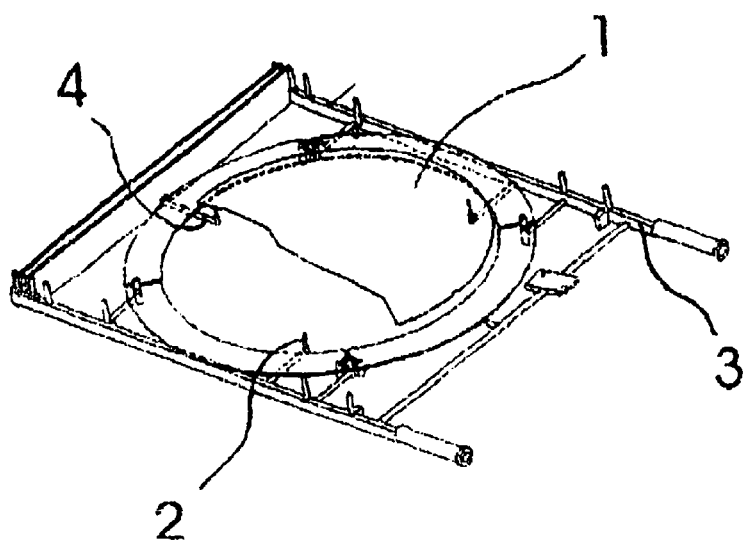
FIG. 1 a schematic, perspective illustration of a substrate carrier pursuant to the state of the art.
Figure 4:
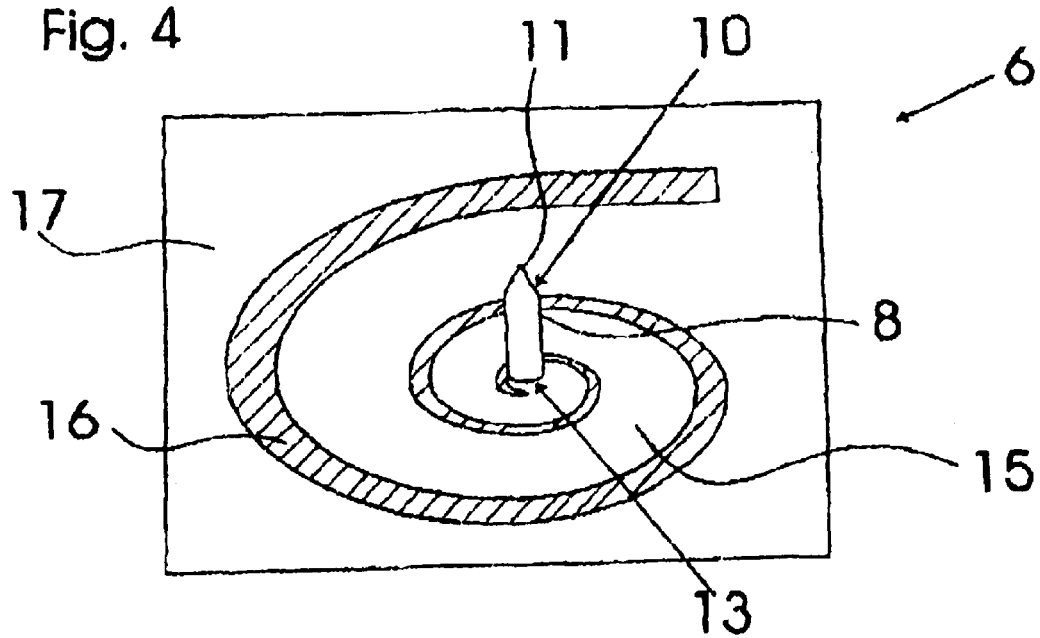
FIG. 4 a schematic, perspective illustration of a resiliently mounted support pin.

FIG. 4 shows a first embodiment of a carrier construction 6 for a support element 8 in the form of a support pin. The support pin 8 has a first end 10 with a support tip 11 for receiving a semiconductor wafer. An opposite end 13 of the support pin 8 is secured in a suitable manner to a flat helical spring 15. The helical spring 15 is formed by cutting out a portion 16 from a thin plate 17, for example a thin quartz plate. Due to the cutout portion 16 in the quartz plate 17, the flat helical spring 15 is resilient not only in a horizontal direction but also in a vertical direction.

Figure 5:
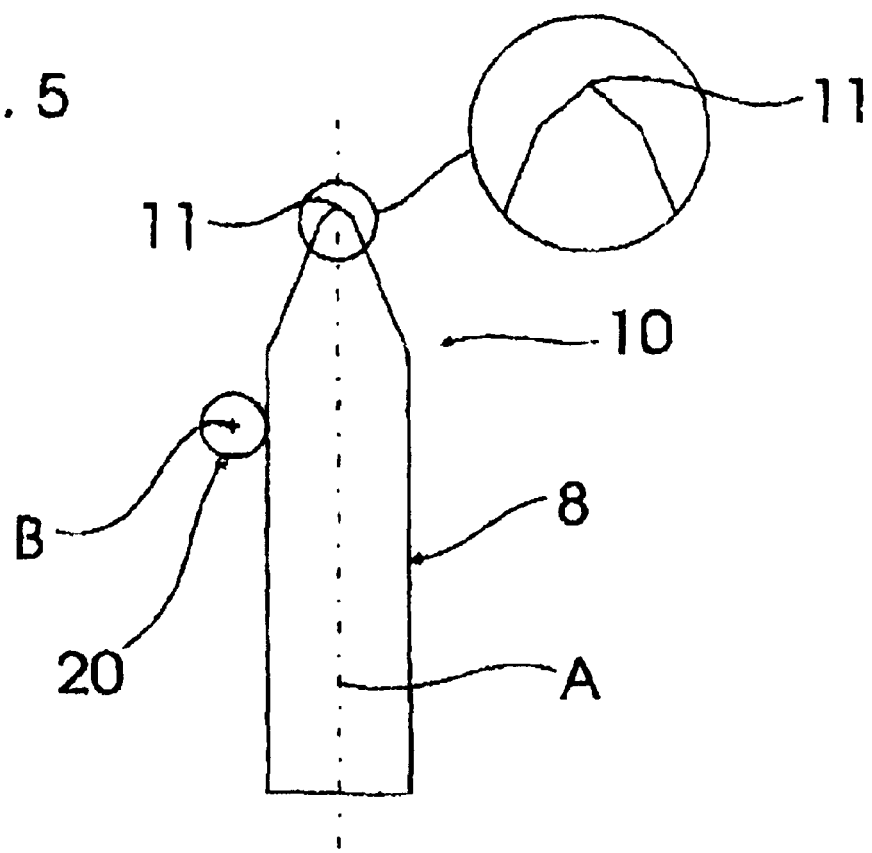
FIG. 5 a schematic side view of a support pin mounted in a swinging manner pursuant to the present invention.
Figure 6:
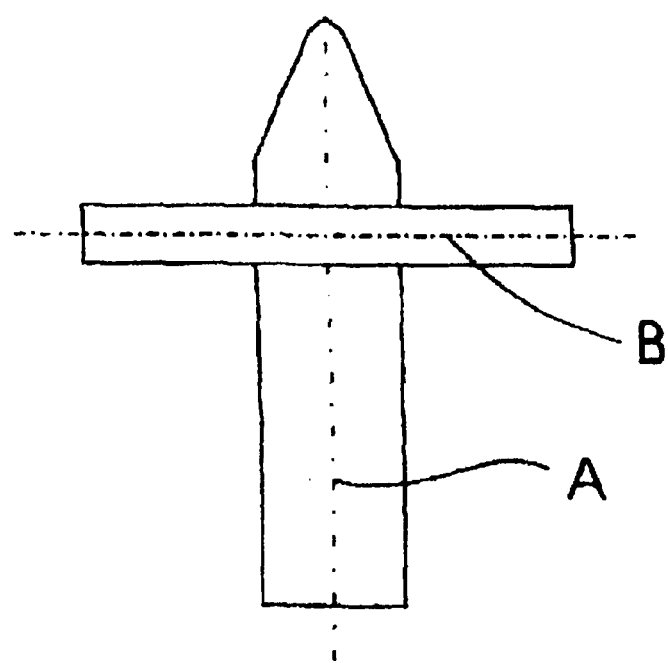
FIG. 6 a schematic side view of the support pin of FIG. 5 with a viewing angle rotated by 90°.

FIGS. 5 and 6 show a second embodiment of the present invention for a movable suspension of a support pin 8. The support pin 8 has a first end 10 on which is formed a support tip 11. In this connection, the end 10 of the support pin 8 is embodied as a double cone. The support tip 11 is formed by one cone having an opening angle between 50 degrees and 130 degrees, and preferably between 80 degrees and 100 degrees. Following this cone is a second cone having an opening or generating angle between 5 and 45 degrees and preferably between 5 and 25 degrees. The thus-formed support tip is sturdy and reduces the danger that the tip will break off.

The support pin 8 has a longitudinal axis A. Mounted on one side of the support pin 8 is a pivot pin 20 having a longitudinal axis B. The longitudinal axis B of the pivot pin 20 extends perpendicular to the longitudinal axis A of the support pin 8, and is laterally offset relative thereto.

The pivot pin 20 is received in a suitable holding device, such as a U-shaped holding device, so that the support pin 8 is mounted in a swinging manner. Due to the fact that the longitudinal axis B of the pivot pin 20 is offset from the central axis A of the support pin 8, the pivot pin 20 is inclined in a rest position. In this connection, the longitudinal axis B of the pivot pin 20 is disposed in such a way that the support pin 8 is inclined relative to a central axis of the wafer that is to be received.

Figure 2A:
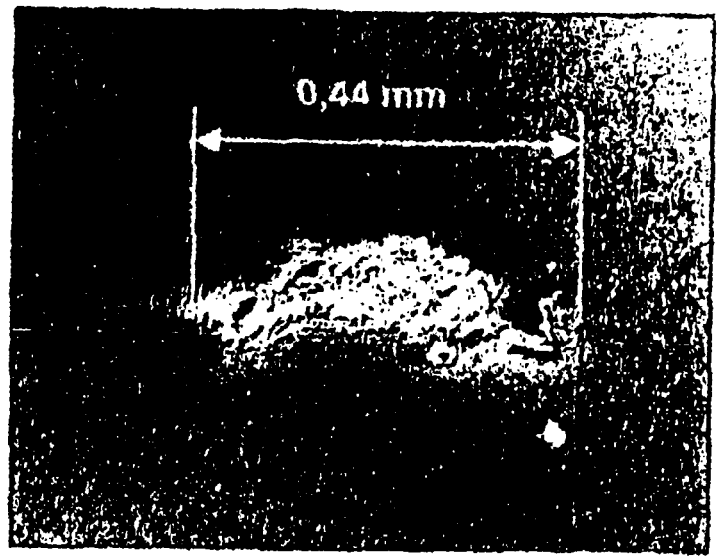
FIGS. 2a and 2b defect locations on the back side of a semiconductor wafer that were produced during the thermal treatment of a semiconductor wafer by support pins pursuant to the state of the art.
Figure 2B:
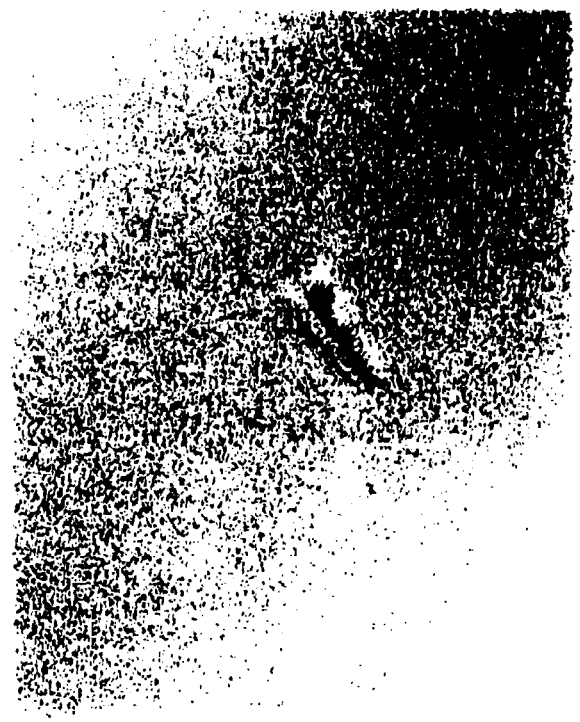
Figure 3A:
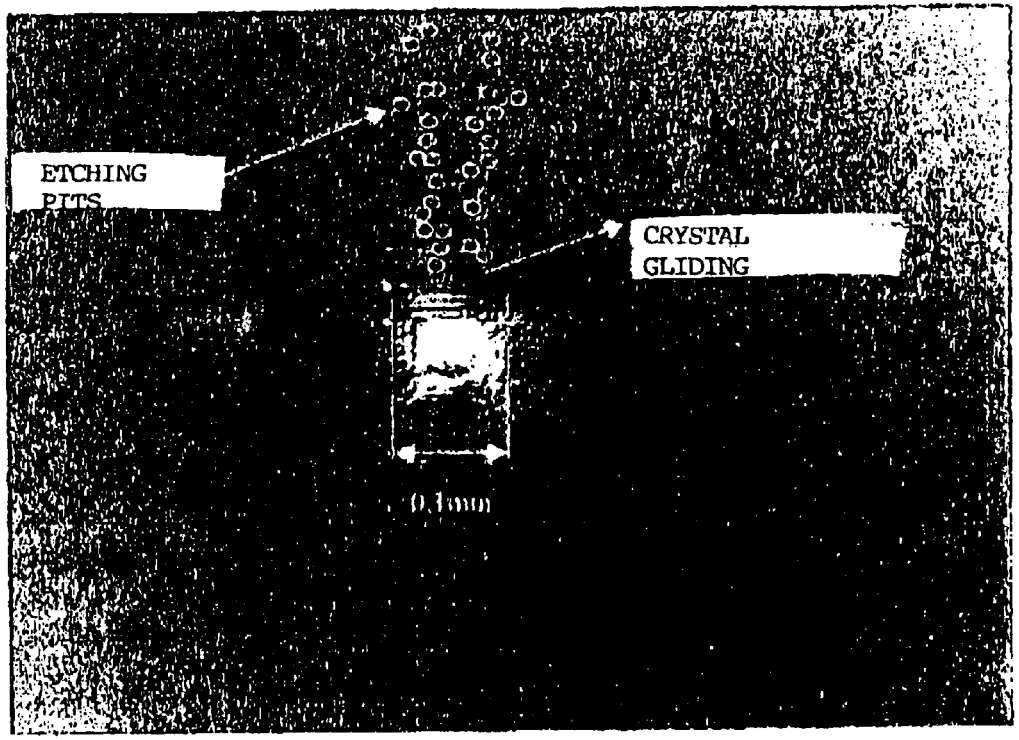
FIGS. 3a and 3b defect locations on the back of a semiconductor wafer that were produced during the thermal treatment by support pins mounted in a swinging manner pursuant to the present invention.
Figure 3B:
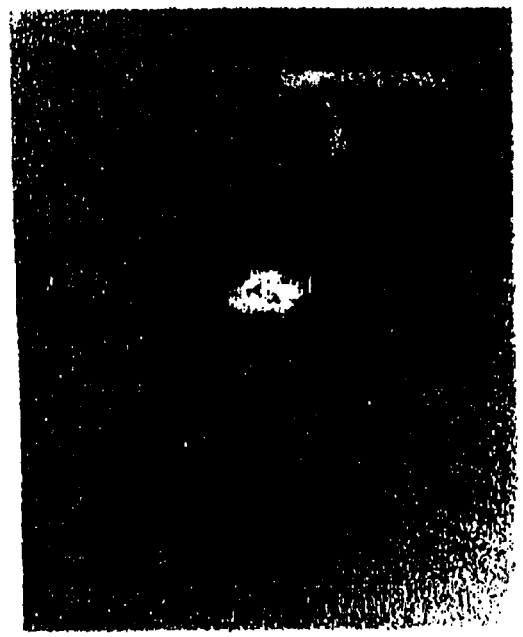

FIGS. 3a and 3b show defect locations on the back side of a semiconductor wafer that were produced during the thermal treatment by swingingly mounted support pins pursuant to FIG. 5. As can be clearly recognized in a comparison to the defect locations shown in FIGS. 2a and 2b, the swingingly mounted support pin produces only a point-type impression rather than an elongated scratch. The damage to the surface of the wafer is thus significantly reduced, which is attributable to the support pin moving along during the thermal expansion of the wafer.

FIG. 16 shows a further embodiment for the movable holding of support elements. In this connection, sleeve-like receiving devices are arranged in a tilted manner for receiving support pins. The support pins are seated with great play in the sleeve, while their angle of tilt is in the range of 1°–45°, preferably between 1°–10°.

Figure 7:
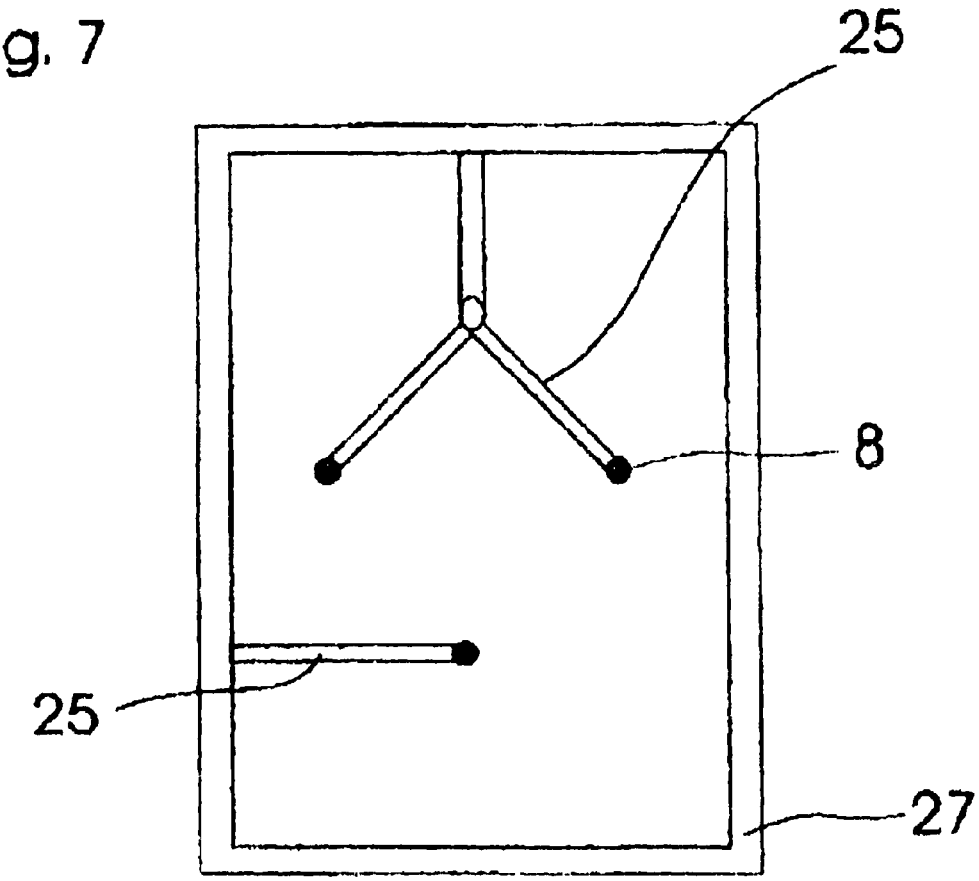
FIG. 7 a plan view of an alternative carrier construction pursuant to the present invention, according to which the support pins are mounted on swinging or resilient carrier arms.

FIG. 7 shows an alternative embodiment for the movable suspension of support pins 8. With the embodiment of FIG. 7, the support pins 8 are mounted on a rigid carrier frame 27 via freely swinging or oscillating carrier arms 25. A total of three support pins 8 are mounted on the carrier frame 7 and form an equilateral triangle upon which a wafer is placed in a centered manner. During a thermal treatment of a wafer placed upon the support pins 8, the freely oscillating carrier arms 25 follow a thermally-caused movement, especially an expansion movement, of the wafer. In addition to the freely oscillating carrier arms 25, the support pins 8 could, of course, also be movably mounted upon the carrier arms.

Figure 8:
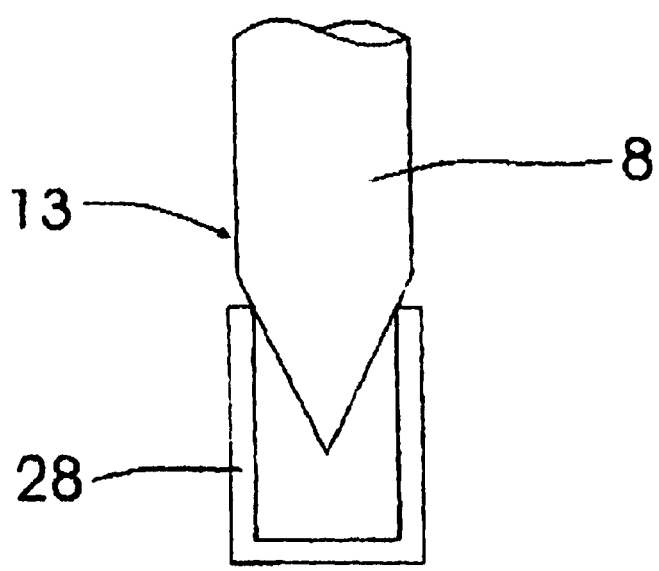
FIG. 8 a detail view of a support pin pursuant to the present invention having a conical base end.

A preferred embodiment for a movable mounting of the support pins 8, for example in combination with the freely oscillating carrier arms, is illustrated in FIG. 8. In this connection, the end 13 that is remote from the support tip 11 has a conical configuration. The conical end 13 is received in a receiving means 28, such as a sleeve, and is pivotably held thereby. Alternatively, the conical end could also simply be received in a hole of the carrier arm 25.

Figure 9:
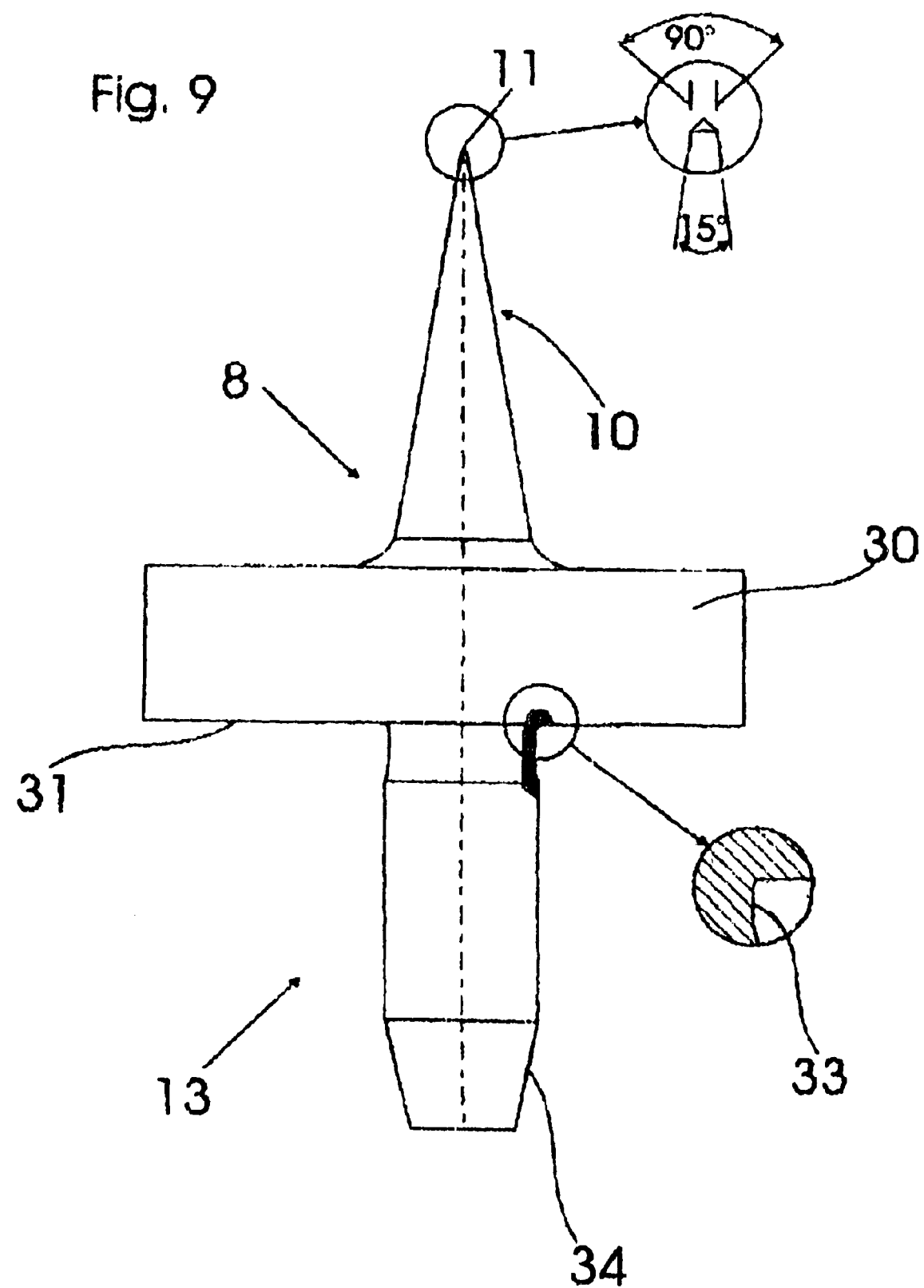
FIG. 9 a schematic side view of an alternative support pin of the present invention.

FIG. 9 shows a further alternative embodiment of a movable support pin 8 pursuant to the present invention. The support pin 8 has a first end 10, which forms a support tip 11. The end 10 is again provided with a double cone, whereby the cone that forms the support tip 11 has an opening angle of 90 degrees, and the following cone has an opening angle of 15 degrees.

Adjoining the second cone is a support flange 30 that provides a considerable widening of the support pin 8 in a middle portion thereof. The support flange 30 forms a support surface 31, which will be described in greater detail subsequently with reference to FIG. 11. Connected below the support flange 30 is a lower end 13 of the support pin 8. In this connection, provided in the transition region between support flange 30 and lower end 13 is an undercut or relief groove 33. Furthermore, the end portion 13 has a tapered end 34.

The support pin 8 is produced from a light-permeable material, such as quartz, in order to avoid a shading effect due to the support pin 8. To achieve a smooth surface and a good transparency of the support pin 8, it is fire polished.

The relief groove 33, as well as the tapered base 34, are provided due to possible changes in the dimensions during this process. In the region of the support tip 11, the support pin 8 is not fire polished, so that this region remains relatively opaque. As a result, the tip does not freely allow the heating radiation through, and is thus itself heated up during a thermal treatment. As a result, the temperature gradient between support tip 11 and wafer is reduced, thereby achieving a greater homogeneity of the wafer temperature.

Figure 10:
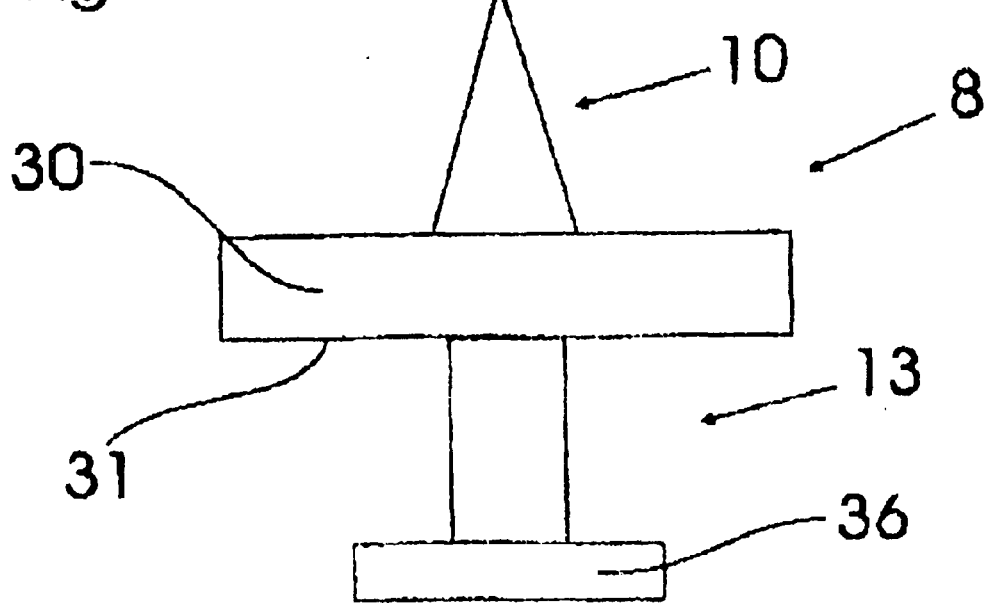
FIG. 10 a schematic side view of a further embodiment of a support pin pursuant to the present invention.

FIG. 10 shows a simplified illustration of an alternative embodiment of a support pin 8. The support pin 8 essentially corresponds to the support pin illustrated in FIG. 9. It has an upper end 10, a support flange 30, and a lower end 13. Provided on the lower end portion 13 is a widened base 36, the function of which will be described in greater detail subsequently with reference to FIG. 11.

Figure 11:
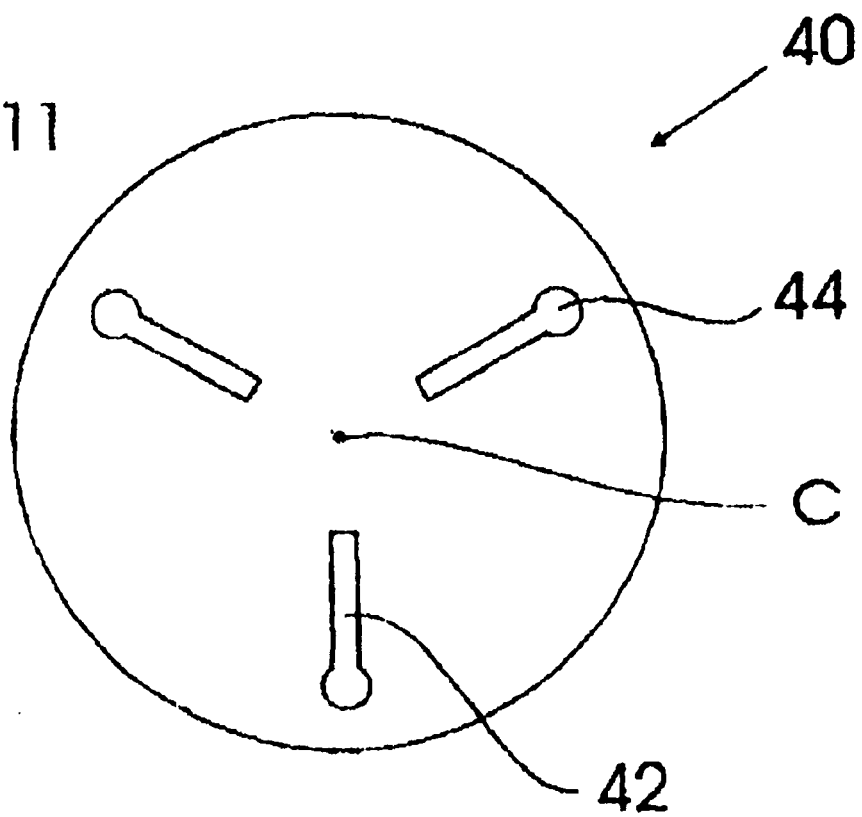
FIG. 11 a guide plate for receiving and guiding a support pin pursuant to FIG. 9 or 10.

FIG. 11 shows a receiving plate 40 for receiving support pins 8 pursuant to FIG. 9 or 10. The receiving plate 40 has three slots 42 that extend radially relative to a central axis C, and that are provided at their radially outer ends with a widened bore 44. The slots 42 are angularly uniformly spaced from one another.

The dimensions of the slots 42 are such that they receive the lower end portion 13 of the support pins 8 of FIGS. 9 and 10 and can guide such end portions in a radial direction. The widened bore 44 is dimensioned such that the widened base portion 36 of the support pin of FIG. 10 passes through the bore 44. However, the bore 44 is not so large that the support flange 30 of the support pin 8 of FIGS. 9 and 10 can also pass through. Rather, the support surfaces 31 of the support flanges 30 come to rest upon the upper side of the receiving plate 40, whereby the support pins 8 are slidingly mounted along the slots 42 and upon the receiving plate 40. The widened base 36 of the support pin 8 of FIG. 10 is dimensioned such that it does not fit through the slots. This prevents the support pin 8 from being moved along with the wafer and coming out of the slot 42 when a wafer is raised. In contrast, the support pin of FIG. 9 has an appropriately lengthened base portion 13 for this purpose.

The receiving plate 40 is made of a light permeable material, such as quartz, in order not to adversely affect the thermal treatment of the wafer.

Although this is not illustrated, the light permeable support flange 30 of the support pin 8 can have a lens-shaped configuration in order to form an optical lens. In this connection, the lens shape is selected such that light radiation of a heating field is focused on the contact location between support tip 11 and wafer. In this way, thermal losses of the wafer at this location are compensated for, and the temperature distribution is homogenized over the surface of the wafer.

Figure 12:
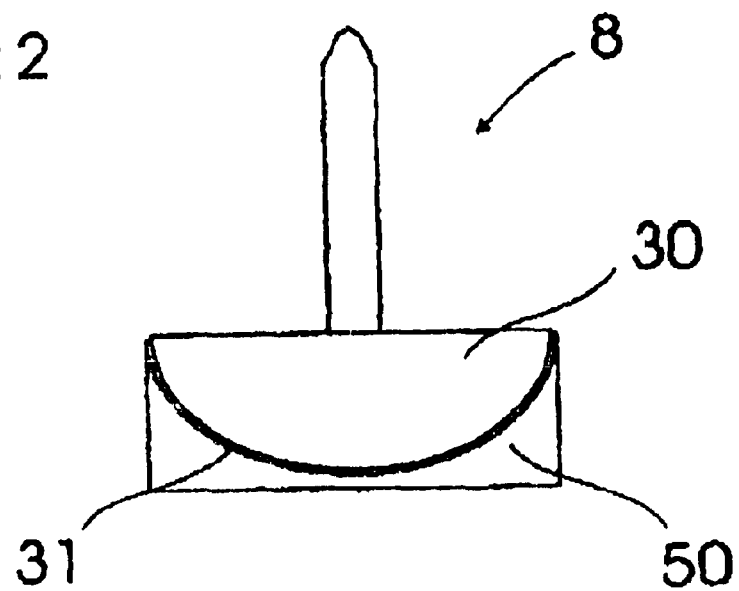
FIG. 12 a schematic cross sectional view through a further embodiment of a support pin pursuant to the present invention.
Figure 13:
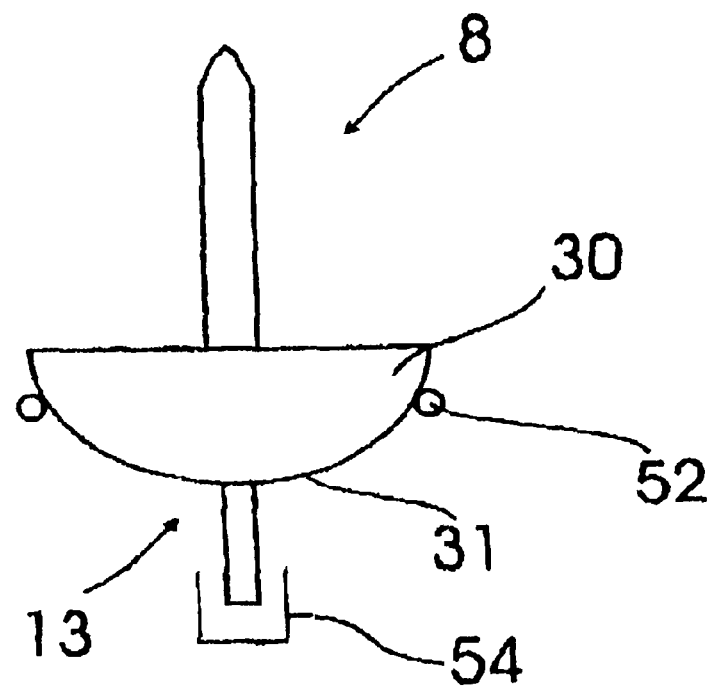
FIG. 13 a further alternative embodiment of a support pin pursuant to the present invention.

FIGS. 12 and 13 show alternative embodiments of support pins 8 having a support flange 30, according to which the support flange 30 is respectively provided with a curved support surface 31.

With the embodiment of FIG. 12, the support flange 30 forms the lowermost portion of the support pin 8. The support flange 30, with its curved support surface 31, is received in a receiving means 50 that is adapted to the curved shape and that is, as is the support pin 8, made of a transparent material. The support pin 8 is pivotably guided within the receiving means 50.

With the embodiment of FIG. 13, an end portion 13 is connected below the support flange 30. The curved or arc-shaped support surface 31 of the support flange 30 rests upon a receiving ring 52 and thus enables a tilting movement of the support pin 8. The end portion 13 is received with relatively great play in a receiving sleeve 54 in order to limit the tilting movement of the support pin 8.

Figure 14A:
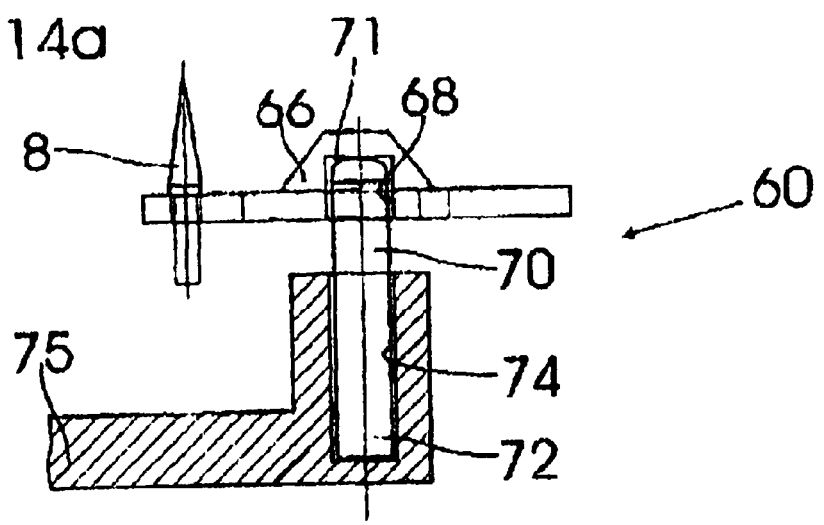
FIGS. 14a and 14b a schematic cross-sectional view as well as a schematic plan view of a holding device for receiving support pins pursuant to the present invention.
Figure 14B:
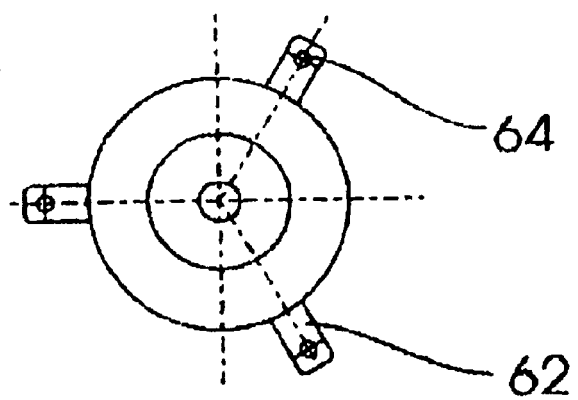
Figure 15:
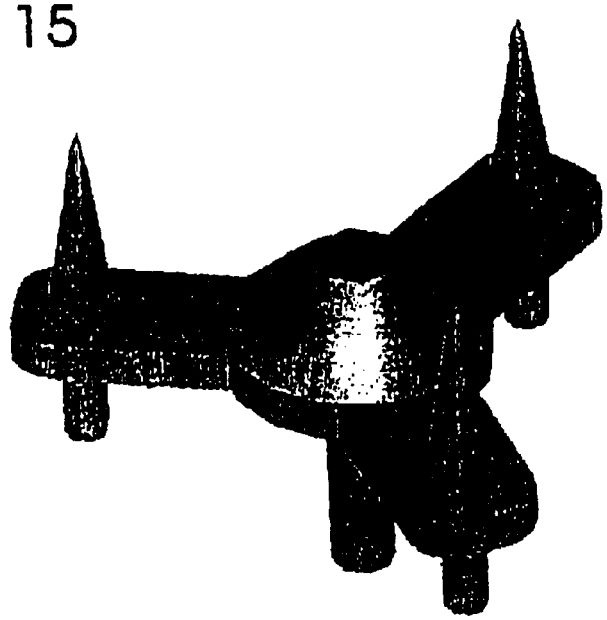
FIG. 15 a perspective view of the holding device of FIG. 14.

FIGS. 14 and 15 show a further alternative embodiment for a movable mounting of support pins 8. With this embodiment, a holder 60 is provided that has three carrier arms 62 that on their free ends are respectively provided with an opening 64 for receiving a support pin 8. The carrier arms 62 extend from a central, roof-shaped central portion 66 in which is formed a downwardly directed blind hole 68. The blind hole 68 serves for receiving a stud 70 having a rounded support end 71. The other end portion 72 of the stud 70 is received in a closely fitting manner in a receiving means 74 of a rigid carrier arm 75.

The blind hole 68 and the stud 70, especially the rounded support end 71, are dimensioned such that the holder 60 is tiltably disposed upon the stud 70. As a result, when a wafer is placed upon the support pins, a self or automatic correction of the support pins 8 is achieved for small deviations in height. A total of three of these holders 60 are provided, so that a wafer is placed on a total of nine support pins 8, in contrast to the previous three support pins 8. As a result, slight pressure forces occur at the respective contact points, thereby reducing damage of the wafer. In addition, a minimal shading of the wafer relative to the heat radiation is achieved, whereby preferably all elements are made of a material, such as quartz, that is transparent for the heat radiation.

Although this is not illustrated, the individual support pins 8 can be respectively movably mounted on the free ends of the carrier arms 62 in order to again be able to follow a movement of the wafer during the thermal treatment. In so doing, a tiltable mounting of the support pins 8, as illustrated by way of example in FIG. 12 or 13, is particularly suitable.

Pursuant to a further, non-illustrated embodiment of the invention, instead of support pins, spheres or balls can be utilized as support elements. Such balls preferably have a diameter between 0.5 mm and 5 mm. During a thermal expansion of the wafer, the balls roll on a base support in conformity with the magnitude of the expansion, and thus always contact only one point of the wafer surface.

In this connection, the movement of the balls can be prescribed by support surfaces, such as grooves. These grooves are preferably inclined relative to a central axis of the substrate in order to ensure that after a wafer has been removed, the balls always roll back into a certain starting position. In this connection, the grooves are preferably disposed relative to one another in the same way as are the slots of FIG. 11.

Pursuant to one preferred embodiment of the invention, in order to receive a wafer three support elements are respectively provided that are disposed at the ends of an equilateral triangle, and hence form a good three-point support. In this connection, the center of the triangle coincides with the central axis of a wafer placed thereupon. Each support element is, in this connection, spaced from the central axis of the wafer by a distance of 0.5 to 0.8 times the wafer radius (R). The spacing is preferably $\frac{2}{3}$ of the wafer radius. If the elements are spaced greater than 0.8 R from the central axis, larger wafers, for example having a diameter of 300 mm, sag in the middle during the thermal treatment. If they are disposed too close to the axis, the rim of the wafer sags downwardly during the thermal treatment. If the support elements are disposed in the above mentioned range, and in particular at $\frac{2}{3}$ of the wafer radius, the sagging of the wafer is at a minimum, as a result of which the formation of dislocation errors or slip lines is minimized. Instead of individual support elements, it is also possible to respectively provide a holder 60 having respectively three support elements at the corner points of the triangle.

Although the invention was described with the aid of preferred embodiments, the present invention is not limited to the specifically illustrated embodiments. In particular, the various ways for mounting or supporting the support elements can be combined with one another. Preferably, all of the described support elements, as well as the support or mounting elements that are correlated therewith, are produced from materials that are transparent for the heat radiation. Such materials are, for example, aluminum nitride, aluminum oxide, zirconium oxide, silicon carbide, boron nitride, sapphire, SAPHAL (trademark of the company Toshiba) or ceramic. Particularly advantageous are quartz, magnesium oxide, silicon and primarily silicon nitride.

The specification incorporates by reference the disclosure of German priority document 100 03 639.2 filed 28 Jan. 2000 and International priority document PCT/EP01/00607 filed 19 Jan. 2001.

The present invention is, of course, in no way restricted to the specific disclosure of the specification and drawings, but also encompasses any modifications within the scope of the appended claims.

What is claimed is:

1. An apparatus for thermally treating substrates in a chamber in which said substrates are placed on support elements, said apparatus comprising support elements that are provided with substrate support tips that are formed by a first cone and a second cone, wherein said first cone has a greater opening angle than does said second cone, and wherein said support elements are movable essentially parallel to a plane of a substrate.

2. An apparatus according to claim 1, wherein said support elements are movable radially relative to a central axis of said substrate.

3. An apparatus according to claim 1, wherein said support elements are resiliently suspended.

4. An apparatus according to claim 3, wherein said support elements are respectively connected with a spring, especially a flat spiral spring.

5. An apparatus according to claim 1, wherein said support elements are pivotable at right angles to a longitudinal axis thereof.

6. An apparatus according to claim 5 wherein a pivot axis of said support elements is spaced from said longitudinal axis thereof.

7. An apparatus according to claim 1, wherein said support elements are mounted on free ends of movable carrier arms.

8. An apparatus according to claim 7, wherein said carrier arms are movable parallel to said plane of said substrate.

9. An apparatus according to claim 1, wherein said support elements are accommodated in a guide means.

10. An apparatus according to claim 9, wherein said guide means is a slot.

11. An apparatus according to claim 1, wherein said support elements are provided with a support flange.

12. An apparatus according to claim 11, wherein said support flange has a curved support surface.

13. An apparatus according to claim 11, wherein said support flange is light permeable and is embodied as an optical lens.

14. An apparatus according to claim 1, wherein a movably, especially tiltably, mounted holding element is provided, and wherein said holding element has at least three carrier arms and said support elements secured thereon.

15. An apparatus according to claim 14, wherein said support elements are movably, especially pivotably, mounted on said carrier arms.

16. An apparatus according to claim 1, wherein said support elements have a conically tapering base that is pivotably accommodated in a receiving means.

17. An apparatus according to claim 1, wherein said first cone has an opening angle of between 50 and 130°, and preferably between 80 and 100°.

18. An apparatus according to claim 17, wherein said second cone has an opening angle between 5 and 45°, and preferably between 5 and 25°.

19. An apparatus according to claim 1, wherein at least one of said support elements and holding devices thereof are disposed on a circle having a radius that is from ½ to ⅘, and preferably ⅔, of a radius of said substrate.

20. An apparatus according to claim 1, wherein at least one of said support elements and holding devices thereof are comprised at least partially of a light-permeable material.

21. An apparatus according to claim 1, wherein surfaces of at least one of said support elements and holding devices thereof are at least partially polished, especially fire polished.

22. An apparatus according to claim 1, wherein at least one of said support elements and holding devices thereof are made of one or a combination of the following materials: quartz, magnesium oxide, zirconium oxide, silicon, silicon nitride, silicon carbide, aluminum oxide, aluminum nitride, boron nitride, sapphire, SAPHAL, and ceramics.

23. An apparatus according to claim 1, wherein said support elements are individually movable essentially parallel to said plane of said support.

* * * * *

UNITED STATES PATENT AND TRADEMARK OFFICE
CERTIFICATE OF CORRECTION

PATENT NO. : 6,953,338 B2  Page 1 of 1
DATED : October 11, 2005
INVENTOR(S) : Kreiser et al.

It is certified that error appears in the above-identified patent and that said Letters Patent is hereby corrected as shown below:

<u>Title page,</u>
Item [54], should read as follows:
-- [54] Title: APPARATUS FOR THERMAL TREATMENT OF SUBSTRATES --.

Signed and Sealed this

Thirteenth Day of December, 2005

JON W. DUDAS
*Director of the United States Patent and Trademark Office*